US012604759B2

(12) United States Patent
Talebbeydokhti et al.

(10) Patent No.: US 12,604,759 B2
(45) Date of Patent: Apr. 14, 2026

(54) MICROELECTRONIC ASSEMBLIES INCLUDING STIFFENERS AROUND INDIVIDUAL DIES

(71) Applicant: Intel Corporation, Santa Clara, CA (US)

(72) Inventors: Pouya Talebbeydokhti, Gilbert, AZ (US); Mohan Prashanth Javare Gowda, Ottobrunn (DE); Sonja Koller, Bavaria (DE); Stephan Stoeckl, Schwandorf (DE); Thomas Wagner, Regelsbach (DE); Wolfgang Molzer, Ottobrunn (DE)

(73) Assignee: Intel Corporation, Santa Clara, CA (US)

( * ) Notice: Subject to any disclaimer, the term of this patent is extended or adjusted under 35 U.S.C. 154(b) by 879 days.

(21) Appl. No.: 17/699,139

(22) Filed: Mar. 20, 2022

(65) Prior Publication Data

US 2023/0298953 A1     Sep. 21, 2023

(51) Int. Cl.
*H01L 23/053*        (2006.01)
*H01L 23/00*        (2006.01)
(Continued)

(52) U.S. Cl.
CPC ............ *H01L 23/053* (2013.01); *H01L 23/06* (2013.01); *H01L 23/10* (2013.01); *H01L 24/16* (2013.01);
(Continued)

(58) Field of Classification Search
CPC ....... H01L 21/563; H01L 21/52; H01L 21/54; H01L 21/565–566; H01L 21/4871–4882; H01L 23/04; H01L 23/10; H01L 23/16; H01L 23/18; H01L 23/42; H01L 23/13; H01L 23/3142; H01L 23/481; H01L 23/562; H01L 23/3135; H01L 2924/16152–16153; H01L 2924/16251; H01L 2924/1511–15153; H01L 2924/1611–1615; H01L 2924/163–1632; H01L 2924/171–172; H01L 2924/181; H01L 23/12; H01L 23/053–057; H01L 23/3121–3128; H01L 23/24; H01L 23/28; H01L 23/31–3114;
(Continued)

(56) References Cited

U.S. PATENT DOCUMENTS 6,531,932 B1    3/2003  Govind et al.
7,459,782 B1    12/2008  Li
(Continued)

FOREIGN PATENT DOCUMENTS

WO        WO-2018231212 A1 *  12/2018

*Primary Examiner* — Dale E Page
*Assistant Examiner* — Douglas Yap
(74) *Attorney, Agent, or Firm* — Akona IP PC

(57) ABSTRACT

Disclosed herein are microelectronic assemblies, as well as related apparatuses and methods. In some embodiments, a microelectronic assembly may include a substrate; a lid surrounding an individual die, wherein the lid includes a planar portion and two or more sides extending from the planar portion, and wherein the individual die is electrically coupled to the substrate by interconnects; and a material surrounding the interconnects and coupling the two or more sides of the lid to the substrate.

18 Claims, 9 Drawing Sheets

(51) Int. Cl.

| | |
|---|---|
| *H01L 23/06* | (2006.01) |
| *H01L 23/10* | (2006.01) |
| *H01L 23/13* | (2006.01) |
| *H01L 23/31* | (2006.01) |
| *H01L 25/10* | (2006.01) |
| *H01L 23/48* | (2006.01) |

(52) U.S. Cl.
CPC .............. *H01L 24/32* (2013.01); *H01L 24/73* (2013.01); *H01L 25/105* (2013.01); *H01L 23/13* (2013.01); *H01L 23/3142* (2013.01); *H01L 23/481* (2013.01); *H01L 2224/16227* (2013.01); *H01L 2224/16237* (2013.01); *H01L 2224/16238* (2013.01); *H01L 2224/32225* (2013.01); *H01L 2224/73204* (2013.01); *H01L 2924/1611* (2013.01); *H01L 2924/16251* (2013.01); *H01L 2924/1631* (2013.01); *H01L 2924/16315* (2013.01); *H01L 2924/1632* (2013.01); *H01L 2924/3511* (2013.01); *H01L 2924/35121* (2013.01); *H01L 2924/37001* (2013.01)

(58) Field of Classification Search
CPC ....... H01L 23/3157–3192; H01L 2224/32225; H01L 2224/162252; H01L 2924/00014; H01L 23/4982; H01L 25/0657; H05K 3/28; H05K 3/3452
See application file for complete search history.

(56) References Cited

U.S. PATENT DOCUMENTS

| | | | |
|---|---|---|---|
| 8,502,400 | B2 | 8/2013 | Karpur et al. |
| 8,952,511 | B2 | 2/2015 | Sathe et al. |
| 9,041,205 | B2 | 5/2015 | Karhade et al. |
| 9,502,368 | B2 | 11/2016 | Tomita et al. |
| 9,515,031 | B2 | 12/2016 | Altunyurt et al. |
| 10,950,552 | B2 | 3/2021 | Kong et al. |
| 2007/0120149 | A1 | 5/2007 | Frutschy et al. |
| 2014/0091461 | A1* | 4/2014 | Shen ...................... H01L 23/24 257/737 |
| 2015/0318236 | A1* | 11/2015 | Zhang ............... H01L 23/49822 174/257 |
| 2016/0095209 | A1 | 3/2016 | Starkston et al. |
| 2016/0268213 | A1 | 9/2016 | Jiang et al. |
| 2017/0018510 | A1* | 1/2017 | Shen ................... H01L 23/3128 |
| 2017/0287799 | A1 | 10/2017 | Klein et al. |
| 2018/0012865 | A1* | 1/2018 | Schrock ............. H01L 23/4334 |
| 2019/0206757 | A1* | 7/2019 | Hayashida .............. H01L 23/34 |
| 2020/0118941 | A1 | 4/2020 | Pon et al. |
| 2020/0402920 | A1 | 12/2020 | Yu et al. |
| 2021/0035738 | A1 | 2/2021 | Goh et al. |
| 2021/0057354 | A1 | 2/2021 | Eid |
| 2023/0062454 | A1* | 3/2023 | Chen ...................... H01L 23/04 |

* cited by examiner

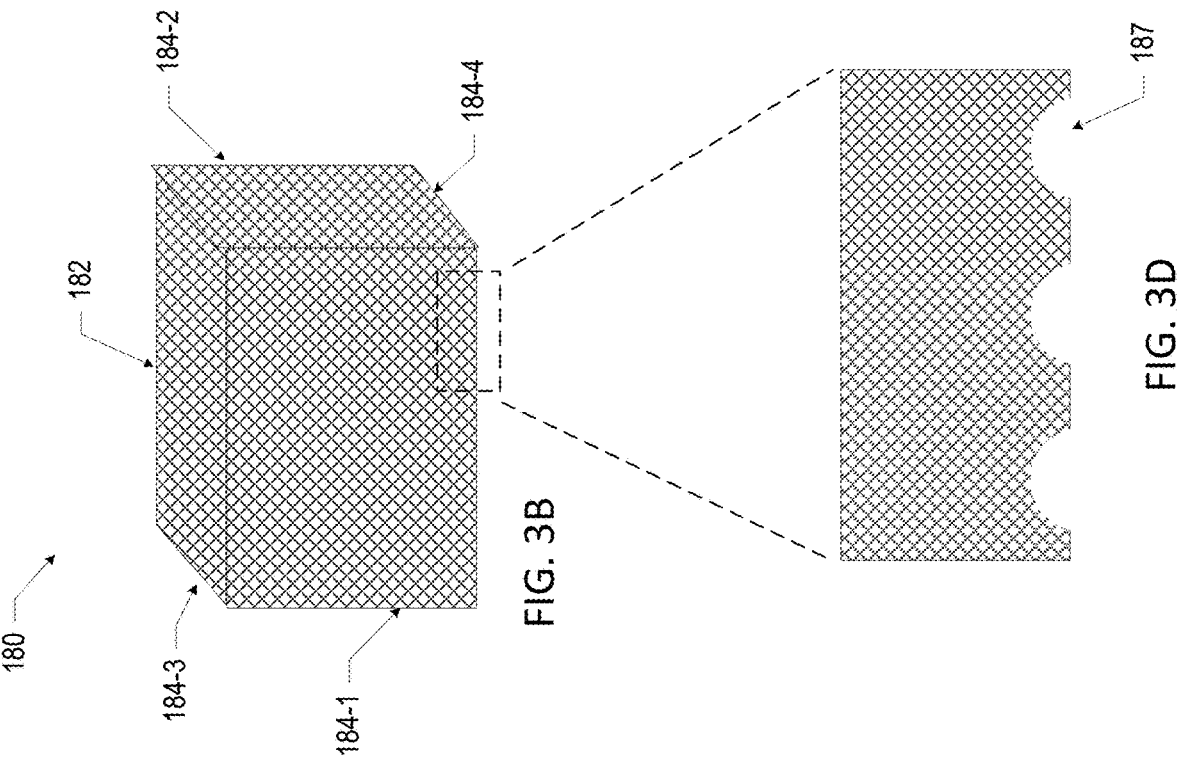
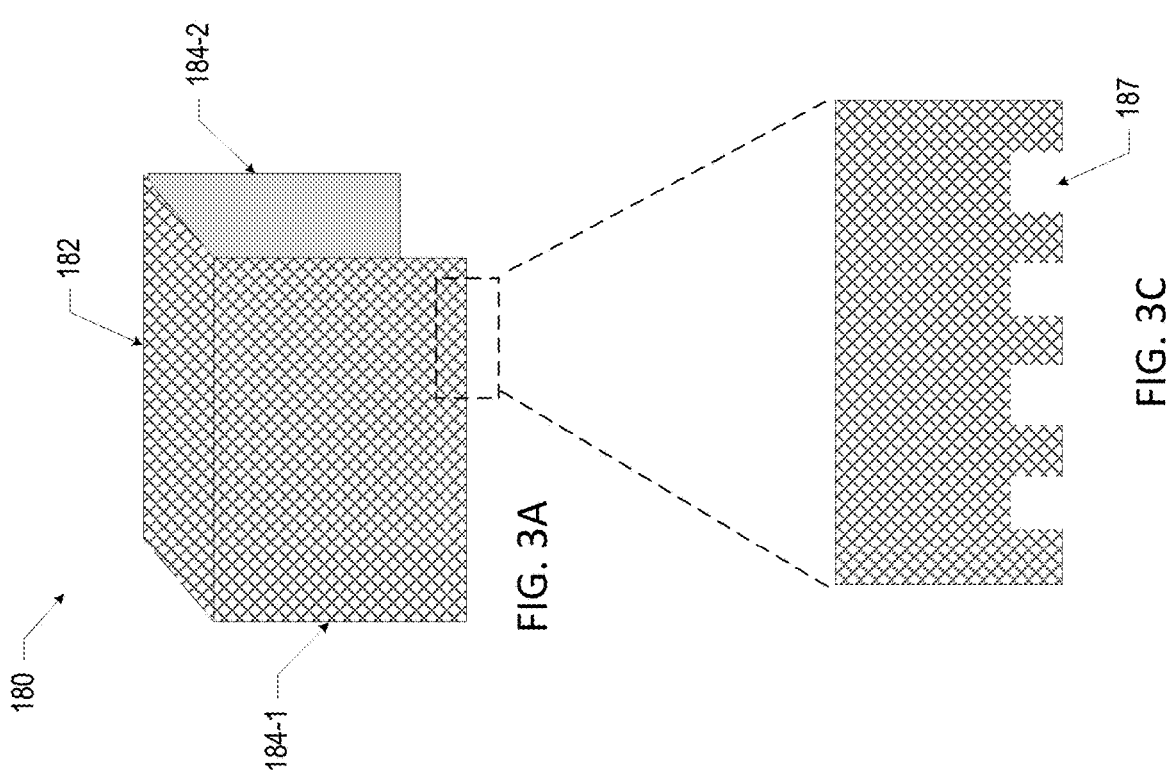

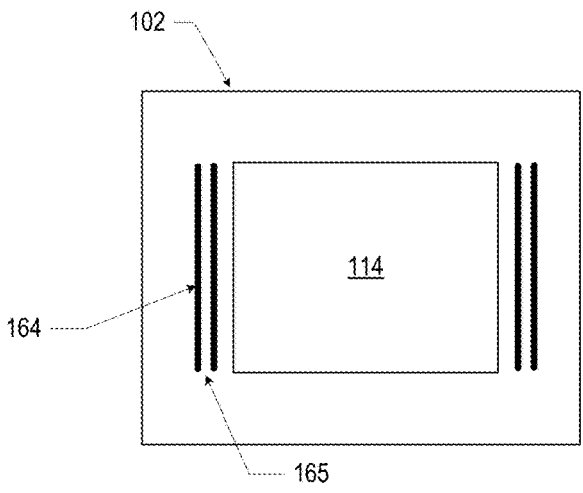
FIG. 4A
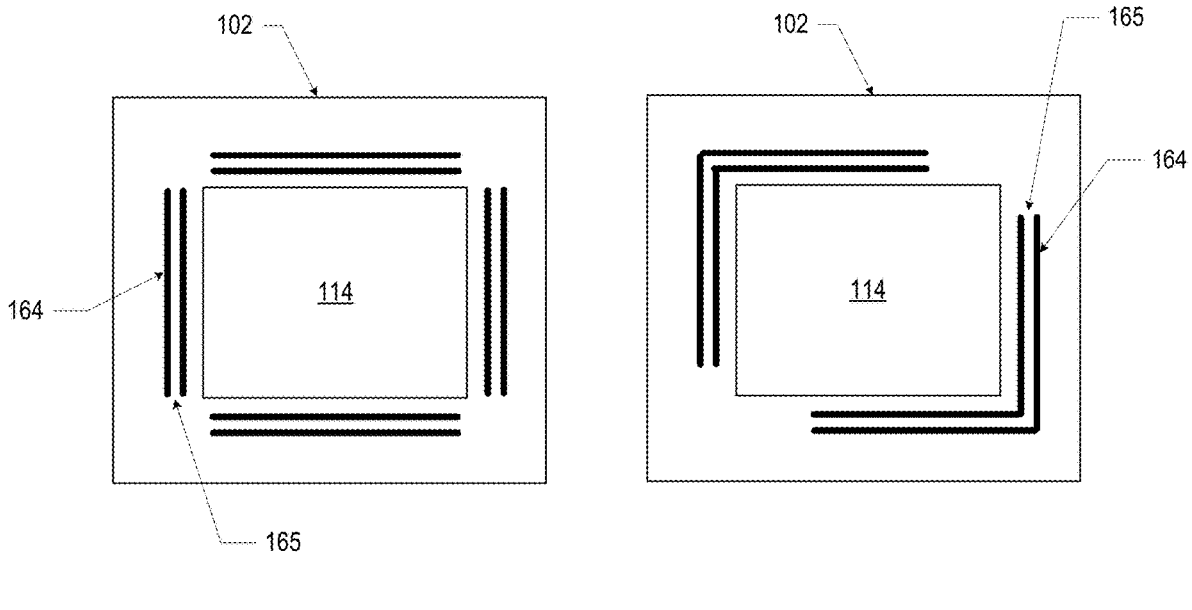
FIG. 4B                              FIG. 4C

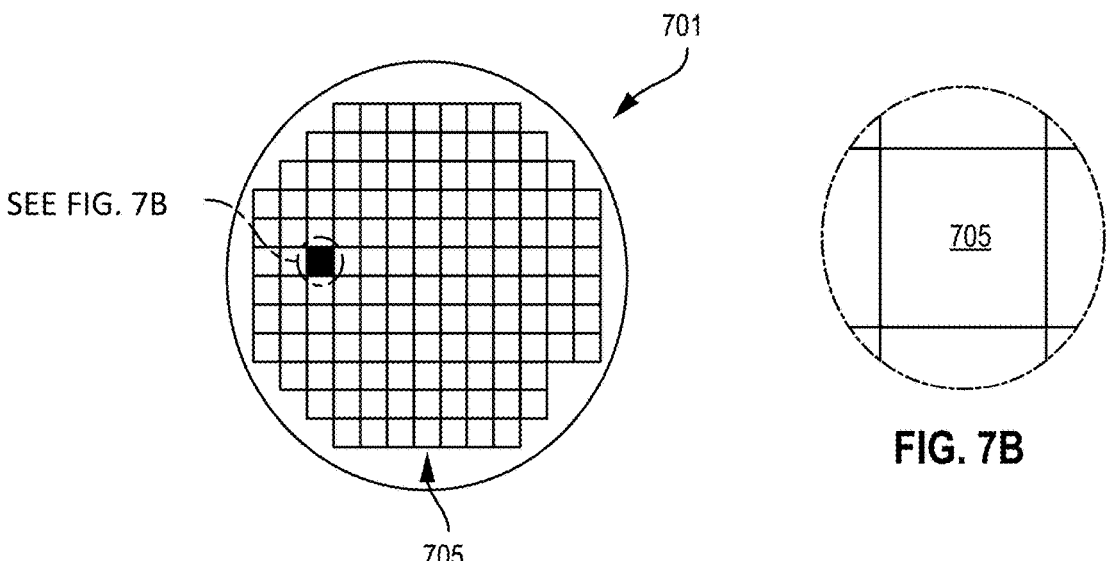
SEE FIG. 7B
701
705
FIG. 7A
705
FIG. 7B
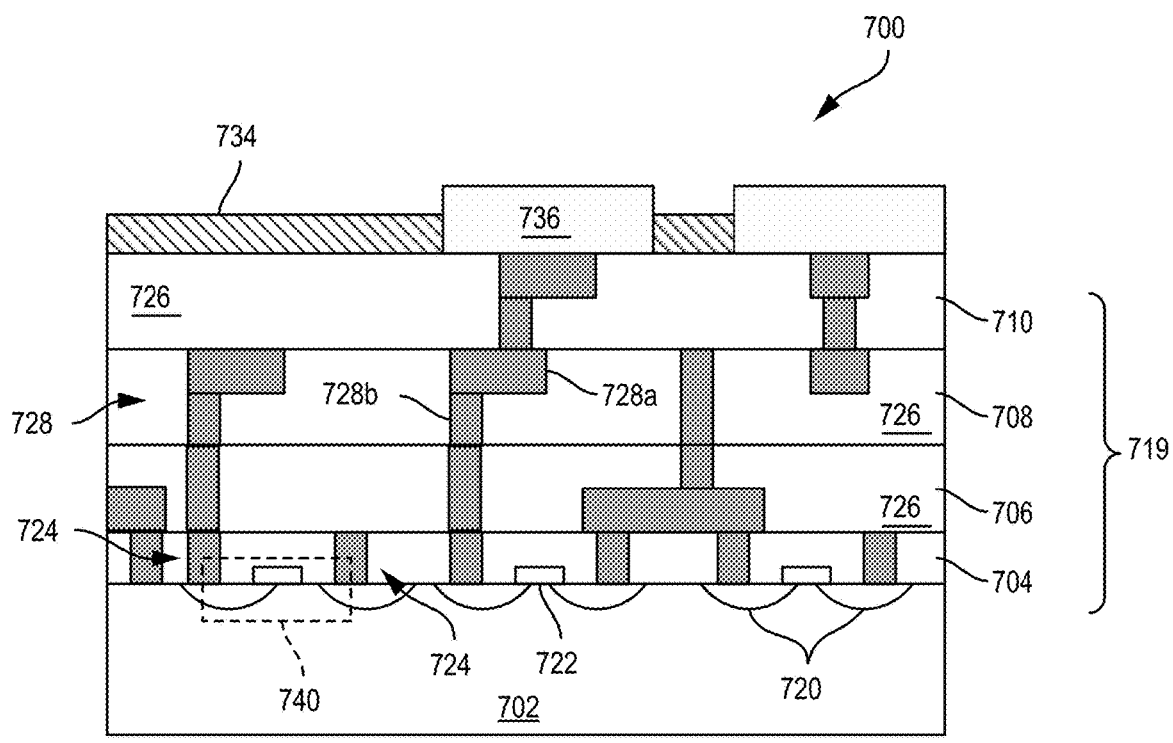
700
734
736
726
728
728b    728a
724
740    724    722    720
702
710
726    708
726    706
704
719
FIG. 7C

MICROELECTRONIC ASSEMBLIES INCLUDING STIFFENERS AROUND INDIVIDUAL DIES

BACKGROUND

Package substrates in integrated circuit (IC) packages are traditionally used to route electrical connections between a die and a circuit board. Dies and other functional components and elements may be disposed on a face of a package substrate. For example, stiffeners may be disposed on a face of the package substrate along with the die to prevent warpage, which is especially useful in coreless, ultra-thin core (UTC), and wafer level integrated circuit products.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A and 3B are perspective views of exemplary stiffeners, in accordance with various embodiments.

FIGS. 3C and 3D are magnified views of a portion of the exemplary stiffeners of FIGS. 3A and 3B respectively, in accordance with various embodiments.

FIGS. 4A-4C are schematic illustrations of top plane views of exemplary microelectronic assemblies including trenches, in accordance with various embodiments.

FIGS. 7A and 7B are top views of a wafer and dies that may be used with any of the embodiments of the microelectronic assemblies disclosed herein.

FIG. 7C is a cross-sectional side view of an integrated circuit device that may be used with any of the embodiments of the microelectronic assemblies disclosed herein.

DETAILED DESCRIPTION

Figure 1:
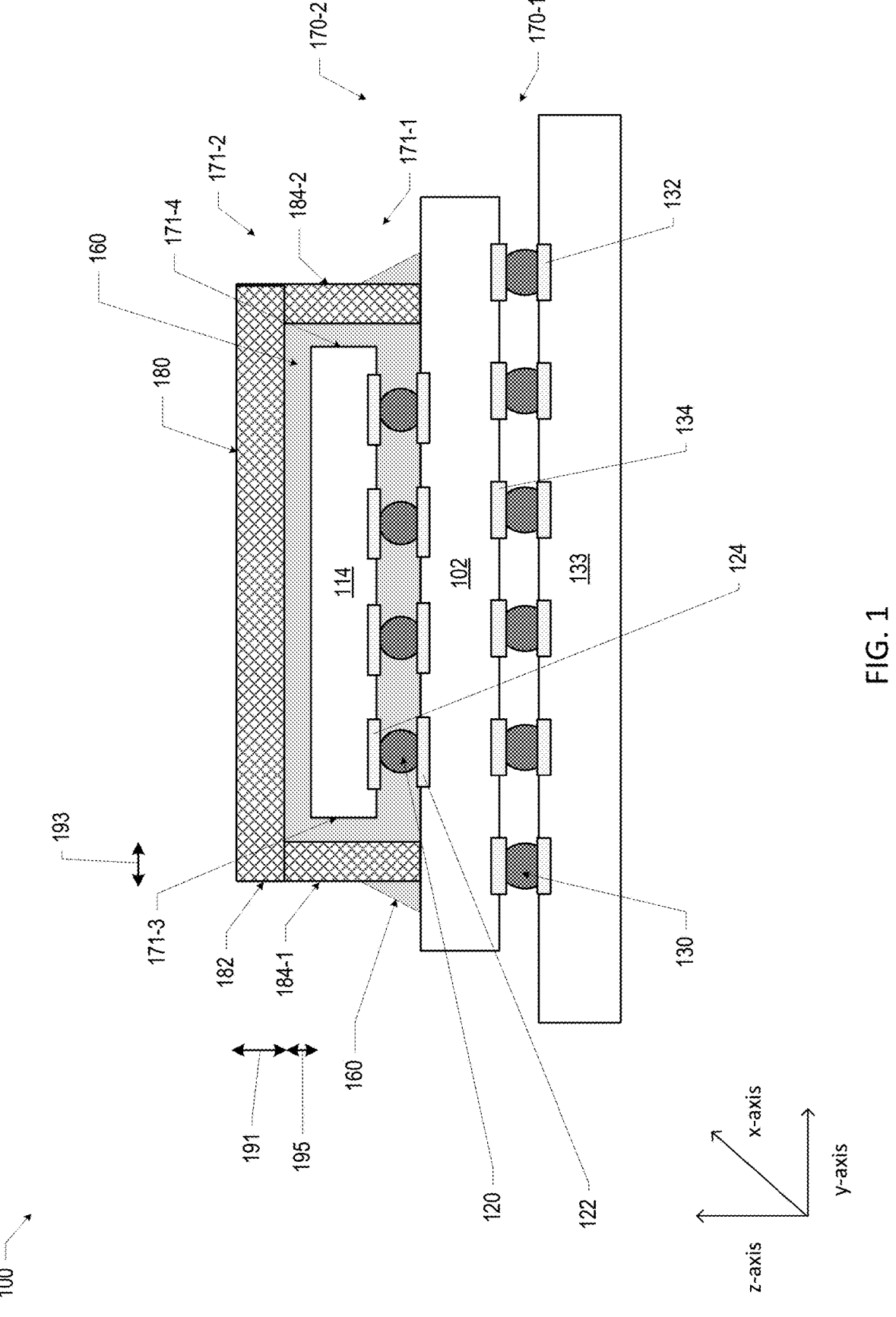
FIG. 1 is a side, cross-sectional view of an exemplary microelectronic assembly, in accordance with various embodiments.

Disclosed herein are microelectronic assemblies, as well as related apparatuses and methods. For example, in some embodiments, a microelectronic assembly may include a substrate; a lid surrounding an individual die, wherein the lid includes a planar portion and two or more sides extending from the planar portion, and wherein the individual die is electrically coupled to the substrate by interconnects; and a material surrounding the interconnects and coupling the two or more sides of the lid to the substrate.

Packaging semiconductor devices presents several challenges. One such challenge is encountered with the demand for miniaturization of semiconductor devices, continually requiring thinner form factors and multiple thermal processing steps. The resulting IC packages may suffer from warpage generated as a result of the mismatch in the coefficient of thermal expansion (CTE) between a thin die and a substrate. Fabrication of an IC package, is a multi-step process, which includes patterning, deposition, etching, and metallization. In final processing, a resulting IC die can be separated and packaged. A first plurality of solder bump structures (e.g., solder bumps, balls, pads, pillar bumps (e.g., copper pillar bumps), etc.) of a generally uniform size can be positioned between the die and a substrate, and the die and substrate can be heated to similar temperatures. The die can then be lowered onto the substrate, in order to mechanically and electrically couple the die to the substrate. Heat can be applied via a solder reflow process to re-melt the solder bumps and attach the die to the substrate. Attachment of the die to the substrate (i.e., primary substrate), to form the IC package, is referred to as a "first level interconnects" (FLI). The FLI may further be underfilled with a non-conductive adhesive to strengthen the mechanical connection between the die and the substrate. One or more such IC packages can be physically and electrically coupled to a secondary substrate, such as a printed circuit board (PCB) or a motherboard. Attachment of the IC package(s) directly to the secondary substrate, such as by soldering, is referred to as a "second level interconnects" (SLI).

Manufacturing of an IC package can involve multiple thermal cycling (or processing) steps. For instance, a substrate may be heated to add solder balls (e.g., flip-chip or controlled collapse chip connection (C4) solder balls) to a substrate. The substrate may again be heated one or more times for die placement and solder reflow. Another thermal cycle may be added if epoxy, for example, is used in the assembly process as an underfill material. An underfilling process, such as capillary-flow underfilling, relies upon capillary pressure of the underfill material, to flow between the substrate and the die. Yet another thermal cycle may be used to incorporate the IC package into an electronic assembly.

The multiple thermal cycles can lead to warpage of components of a resulting IC package or electronic assembly. Warpage refers to a bending or twist or general lack of flatness in an overall IC package, for example, including particularly the plane formed by solder joint locations. Such warpage is caused by a difference in CTE between one part or component and another. The problem of IC package warpage can be exacerbated in larger packages due to the larger size, and can also be exacerbated when soldering temperatures become higher and IC packages become thinner Recently, the use of lead-free solders has become more prevalent on certain product types. This lead-free solder generally requires a higher soldering temperature than prior solders.

Warpage can pose a problem in forming solder joints, or interconnections, in IC packages. A lack of flatness can occur where the entire package warps so that it is curved or bent or otherwise non-flat. Lack of flatness in an IC package can cause various problems such as poor soldered joints between the IC package and a substrate, poor or no contact at the solder joints, undesirably pillowed joints, or intermittent contact at the solder joints. Such warpage can cause an IC package or an electronic assembly to fail. Package warpage is a significant challenge as it impacts the ability to handle the package during assembly steps. In addition, package warpage produces yield losses during reflow, which are typically caused by open (non-contacting) second layer interconnects in the locations having the maximum warpage-induced vertical displacement. As such, package warpage is therefore a major problem for package designs and, in particular, ultra-thin package designs.

One solution to the problem of IC package warpage has been the incorporation of a flat stiffener plate on top of the IC package to maintain planarity of the components. The stiffener plate takes the form essentially of a completely flat, entirely planar item generally having a constant thickness, and has a same shape as the IC package such that a perimeter of the stiffener plate is approximately a same size as a perimeter of the IC package when viewed from the top, although other shapes are contemplated. A central region of the stiffener plate may be cut out (include an aperture) to accommodate for one or more components, such as a die or dies, for example. Some stiffener plates include a frame or a ring attached to the perimeter of the stiffener plate, where the frame or ring is glued or soldered to a substrate along the perimeter of the IC package. Such stiffeners require large keep out zones (e.g., areas where electrical connections cannot be formed) and require growing the package in length and/or width (e.g., in the x-direction and/or the y-direction). Other stiffener plates may be attached to the substrate by adhesive (e.g., a discrete stiffener having a picture frame design), which can be a thermally set adhesive dispensed in liquid, semi-liquid or preformed formats. A bottom surface of the stiffener that attaches to the substrate is covered by adhesive. This packaging solution has several problems, including: (i) requiring the sequential assembly of a stiffener to each package (typically after forming an epoxy layer to attach the stiffener) which thus adds assembly steps and reduces throughput; (ii) using an epoxy layer to attach the stiffener, which limits the effectiveness of warpage reduction as epoxy has a lower modulus than the stiffener material which is typically metal (i.e., resulting in a slightly compliant mechanical coupling between the substrate and stiffener itself); (iii) handling of thin discrete stiffeners (e.g., roughly 50 um or less) which is extremely challenging; (iv) using a one-piece stiffener to reduce the amount of handling and number of assembly steps, which limits the available shapes of the discrete stiffener to be used and also consumes additional surface area of the substrate that could be used for other components; (v) the limited selection of materials (e.g., stainless steel or copper foil) available to form the discrete stiffener; (vi) poor adhesion of the discrete stiffener to other materials (e.g., epoxy molding compounds), making the combination of using the stiffener and subsequent molding encapsulation not a feasible option for many architectures due to delamination; (vii) forming the stiffener on the substrate by using semi-additive deposition (e.g., lithography and plating), which limits the available materials that can be used to form the stiffener (e.g., copper (Cu) or few other metals) and is typically a slow process (e.g., electroplating tens of microns can take hours) requiring expensive lithography steps and equipment, and (viii) the tendency for the adhesive to "bleed" and spread onto wire bond surfaces, such as wire bond pads or other noble metal surfaces, such as ground rings or voltage rings, and adhere thereto which results in unsatisfactory electrical contacts and poor performance of the IC package. Various ones of the embodiments disclosed herein may help achieve improved performance of IC packages, with reduced warpage, relative to conventional approaches by placing a lid frame stiffener on an individual die and attaching the sides of the stiffener to a substrate using an underfill material and a curing process. By attaching the stiffener concurrently with the curing process for interconnect underfill, the need for a solder connection and a reflow process or an adhesive step, as required in conventional approaches, is eliminated. Further, by attaching the stiffener around an individual die, the size of the keep out zone is greatly reduced, which enables a smaller package form factor, as distances to the package edges or other dies may be decreased.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. The accompanying drawings are not necessarily drawn to scale. Although many of the drawings illustrate rectilinear structures with flat walls and right-angle corners, this is simply for ease of illustration, and actual devices made using these techniques will exhibit rounded corners, surface roughness, and other features.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die," an "IC die," "a microelectronic component," and "an electrical component." The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

When used to describe a range of dimensions, the phrase "between X and Y" represents a range that includes X and Y. For convenience, the phrase "FIG. 2" may be used to refer to the collection of drawings of FIGS. 2A-2C, the phrase "FIG. 3" may be used to refer to the collection of drawings of FIGS. 3A-3D, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

An "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias.

FIG. 1 is a side, cross-sectional view of a microelectronic assembly 100, in accordance with various embodiments. The microelectronic assembly 100 may include a package substrate 102 with a die 114 and a stiffener 180 disposed thereon. The stiffener 180 may include a planar portion 182 and two or more sides 184-1, 184-2 extending from the planar portion. As used herein, the terms "lid framed stiffener," "stiffener," "lid," and "lid component" may be used interchangeably. The package substrate 102 may have a bottom surface (e.g., a first surface 170-1) and an opposing top surface (e.g., a second surface 170-2). The die 114 may have a bottom surface (e.g., a first surface 171-1), an opposing top surface (e.g., a second surface 171-2), and side surfaces 171-3, 171-4. The stiffener 180 may be positioned with the planar portion 182 on a top surface 171-2 of the die 114 and the two or more sides 184-1, 184-2 extending along the respective side surfaces 171-3, 171-4 of the die 114. The die 114 may be electrically coupled to the package substrate 102 by first level interconnects 120. The first level interconnects 120 may be surrounded by an underfill material 160 (e.g., the underfill material 160 may be disposed between the die 114 and the second surface 170-2 of the package substrate 102). The two or more sides 184-1, 184-2 may be attached or secured to the top surface 170-2 of the package substrate 102 by the underfill material 160. In some embodiments, the underfill material 160 further may be between the die 114 and the stiffener 180 (e.g., the underfill material 160 may at least partially or may completely fill the space between the die 114 and the stiffener 180, as shown in FIG. 1). The package substrate 102 may have first conductive contacts 134 on the first surface 170-1 and second conductive contacts 122 on the second surface 170-2. The die 114 may have the first surface 171-1 having conductive contacts 124. The conductive contacts 124 on the first surface 171-1 of the die 114 may be coupled to the conductive contacts 122 on the second surface 170-2 of the package substrate 102 via the first level interconnects 120. In some embodiments, the first level interconnects 120 may include solder bumps (as illustrated in FIG. 1) or copper pillar in flip chip technology; in other embodiments, the first level interconnects 120 may include wires for wire bond technology, or any other suitable interconnects surrounded by an underfill material 160.

The stiffener 180 may be made from any suitable material, including a conductive material, such as a metal (e.g., copper or aluminum), or a non-conductive material, such as, ceramic, ceramic and metal, or silicon carbide and diamond, and made using any suitable technique, such as molding or sintering. The stiffener 180 may have any suitable dimensions and shape. For example, the dimensions of the stiffener 180 may depend on the surface area (e.g., the x-y dimensions of the die 114) and on the available surface area (e.g., the die-attach area versus the non-die-attach area or keep out zone around the die on the surface of the package substrate). The stiffener 180 may have any suitable thickness. The thickness of the stiffener may depend on the type of material or materials used to mitigate warpage, and may further depend on the size of the stiffener 180. For example, a stiffener 180 having larger x-y dimensions (e.g., length and/or width) may have a greater thickness and/or be made of more rigid material. In some embodiments, a thickness 191 (e.g., z-height or z-dimension) and/or a width 193 (e.g., y-dimension) of the stiffener may be between 200 microns and 400 microns. In embodiments where the underfill material 160 is between the die 114 and the stiffener 180, a thickness 195 of the underfill material 160 may be between 25 microns and 50 microns. In some embodiments, the stiffener may have a protective layer or other layer deposited on the top surface to, for example, facilitate thermal dissipation.

The stiffener 180 may be attached or coupled to the surface 170-2 of the package substrate 102 by curing the underfill material 160. The underfill material 160 may be any suitable material. The underfill material 160 may be an insulating material, such as an appropriate epoxy material. In some embodiments, the underfill material 160 may include a capillary underfill, a thermal interface material (TIM), non-conductive film (NCF), or molded underfill. The underfill material 160 may be selected to have a CTE that may mitigate or minimize the stress between the die 114 and the package substrate 102. In some embodiments, the underfill material 160 may include an epoxy flux that assists with soldering the die 114 to the package substrate 102 when forming the first level interconnects 120, and then polymerizes and encapsulates the first level interconnects 120 and a bottom portion of the sides 184 of the stiffener 180 coupling the stiffener 180 to the package substrate 102. In some embodiments, the CTE of the underfill material 160 may have a value that is intermediate to the CTE of the package substrate 102 (e.g., the CTE of the dielectric material of the package substrate 102) and a CTE of the die 114. The underfill material 160 may be dispensed using any suitable process, such as capillary underfill process or molded underfill process.

The die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a Ill-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 7. The conductive pathways in the die 114 may be bordered by liner materials, such as adhesion liners and/or barrier liners, as suitable.

The package substrate 102 may include an insulating material (e.g., a dielectric material formed in multiple layers, as known in the art) and one or more conductive pathways (not shown) to route power, ground, and signals through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), BT resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In particular, when the package substrate 102 is formed using standard PCB processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable. In some embodiments, the package substrate 102 may be a coreless substrate, a UTC substrate, a wafer level packaging, or any other suitable package designed to minimize z-height, as is known in the art. The package substrate 102 may include conductive pathways (not shown) that allow power, ground, and other electrical signals to move between the die 114 and the package substrate 102. In some embodiments, the die 114 and stiffener 180 may not be coupled to a package substrate 102, but may instead be coupled to an interposer, an other substrate, or a circuit board, such as a PCB.

In some embodiments, the package substrate 102 may be formed using a lithographically defined via packaging process. In some embodiments, the package substrate 102 may be manufactured using standard organic package manufacturing processes, and thus the package substrate 102 may take the form of an organic package. In some embodiments, the package substrate 102 may be a set of redistribution layers formed on a panel carrier by laminating or spinning on a dielectric material, and creating conductive vias and lines by laser drilling or ablation and plating. In some embodiments, the package substrate 102 may be formed on a removable carrier using any suitable technique, such as a redistribution layer technique. Any method known in the art for fabrication of the package substrate 102 may be used, and for the sake of brevity, such methods will not be discussed in further detail herein.

In some embodiments, the package substrate 102 may be a lower density medium and the die 114 may be a higher density medium or have an area with a higher density medium. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process). In other embodiments, the higher density medium may be manufactured using semiconductor fabrication process, such as a single damascene process or a dual damascene process.

The microelectronic assembly 100 may further include a circuit board 133. The first conductive contacts 134 on the first surface 170-1 of the package substrate 102 may be coupled to conductive contacts 132 on a surface of the circuit board 133 via second level interconnects 130. In some embodiments, the second level interconnects 130 may include solder balls (as illustrated in FIG. 1) for a ball grid array (BGA) coupling; in other embodiments, the second level interconnects 130 may include solder paste contacts to provide land grid array (LGA) interconnects, or any other suitable interconnect. In some embodiments, the circuit board 133 may include one or more components disposed thereon (not shown). The circuit board 133 may include conductive pathways that allow power, ground, and other electrical signals to move between the circuit board 133 and the package substrate 102 as well as between the circuit board 133 and the die 114, as known in the art.

Although a single die 114 is illustrated in FIG. 1, this is simply an example, and the microelectronic assembly 100 may include one or more dies 114. The dies may perform any suitable functionality, and may include processing devices, memory, communications devices, sensors, or any other computing components or circuitry. For example, the dies may include a central processing unit (CPU), a platform controller hub (PCH), a dynamic random access memory (DRAM), a graphic processing unit (GPU), and a field programmable gate array (FPGA).

Although FIG. 1 illustrates a single IC package (e.g., package substrate 102 with die 114) disposed on the circuit board 133, this is simply for ease of illustration and multiple IC packages with multiple dies may be disposed on the circuit board 133. In some embodiments, the circuit board 133 may be a PCB (e.g., a motherboard). In some embodiments, the circuit board 133 may be another IC package, and the microelectronic assembly 100 may be a package-on-package structure. In some embodiments, the circuit board 133 may be an interposer, and the microelectronic assembly 100 may be a package-on-interposer structure.

Many of the elements of the microelectronic assembly 100 of FIG. 1 are included in other ones of the accompanying figures; the discussion of these elements is not repeated when discussing these figures, and any of these elements may take any of the forms disclosed herein. Some of the elements of the microelectronic assembly 100 of FIG. 1 are not included in other ones of the accompanying figures for simplicity, but a microelectronic assembly 100 may include these omitted elements. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP. For example, the microelectronic assemblies 100 disclosed herein may include one or more dies 114 and one or more stiffeners 180.

Figures 2A, 2B, 2C:
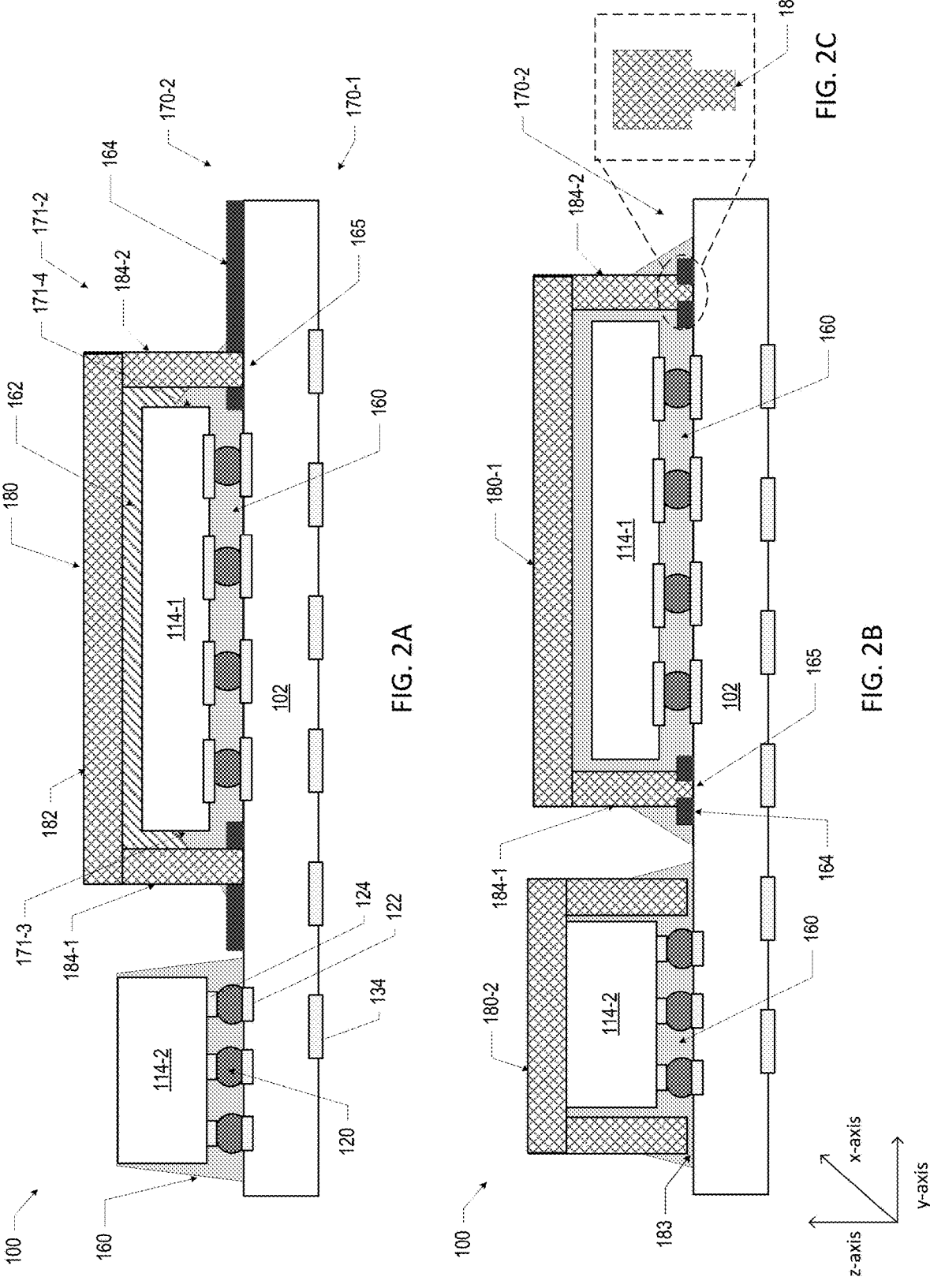
FIG. 2A is a side, cross-sectional view of another exemplary microelectronic assembly, in accordance with various embodiments.
FIG. 2B is a side, cross-sectional view of another exemplary microelectronic assembly, in accordance with various embodiments.
FIG. 2C is a magnified view of a portion of the exemplary stiffener of FIG. 2B, in accordance with various embodiments.

FIG. 2A is a side, cross-sectional view of a microelectronic assembly 100, in accordance with various embodiments. The microelectronic assembly 100 may include a package substrate 102 with dies 114-1, 114-2 and a stiffener 180 disposed thereon. The dies 114-1, 114-2 may be electrically coupled to the package substrate 102 by first level interconnects 120. The first level interconnects 120 may be surrounded by an underfill material 160. A material 164, such as a solder resist material, may be disposed on the second surface 170-2 of the package substrate 102 forming a trench 165 for positioning the two or more sides 184-1, 184-2 of the stiffener 180. The trench 165 may have any suitable size and shape, as described below with reference to FIG. 4. The two or more sides 184-1, 184-2 may be attached or secured to the top surface 170-2 of the package substrate 102 by the underfill material 160. The underfill material 160 may extend at least partially along a thickness of the sides 171-3, 171-4 of the die 114-1 from the second surface 170-2 of the package substrate. As shown in FIG. 2A, an overfill material 162, such as an overmold material, a TIM, or an adhesive, may be disposed between the planar portion 182 of the stiffener 180 and a top surface 171-2 of the die 114-1 and may further extend, at least partially, along the sides 171-3, 171-4 of the die 114-1 towards the second surface 170-2 of the package substrate 102 (e.g., the overfill material 162 may at least partially fill the space between the die 114-1 and the stiffener 180, as shown in FIG. 2A). In some embodiments, a package substrate 102 may include a plurality of individual dies 114 surrounded by individual stiffeners 180.

FIG. 2B is a side, cross-sectional view of a microelectronic assembly 100, in accordance with various embodiments. The microelectronic assembly 100 may include a package substrate 102 with a first die 114-1 and a first stiffener 180-1 disposed thereon and a second die 114-2 and a second stiffener 180-2 disposed thereon. The dies 114-1, 114-2 may be electrically coupled to the package substrate 102 by first level interconnects 120. The first level interconnects 120 may be surrounded by an underfill material 160. A material 164, such as a solder resist material, may be disposed on the second surface 170-2 of the package substrate 102 forming a trench 165 for positioning the two or more sides 184-1, 184-2 of the stiffener 180-1. The first and second stiffeners 180-1, 180-2 may be attached or secured to the top surface 170-2 of the package substrate 102 by the underfill material 160. As shown for the second stiffener 180-2, in some embodiments, the underfill material 160 may fill a space 183 between a bottom surface of the stiffener 180-2 and the second surface 170-2 of the package substrate 102. As shown for the first stiffener 180-1, in some embodiments, a bottom surface of the side 184 of the stiffener 180-1 may include a rail 185 (e.g., a narrowed portion) or other similar feature along a foot of the stiffener to increase attachment to the package substrate 102. in some embodiments, a rail 185 may have a width (e.g., y-dimension) between 10 microns and 50 microns.

FIGS. 3A and 3B are perspective views of exemplary stiffeners, in accordance with various embodiments. As shown in FIG. 3A, in some embodiments, the stiffener 180 may have two opposing sides 184 (e.g., a first side 184-1 and a second side 184-2) extending from a planar portion 182. In some embodiments, the stiffener 180 may have three sides 184 (e.g., may be C-shaped along a perimeter of the planar portion 182 of the stiffener 180)(not shown). As shown in FIG. 3B, in some embodiments, the stiffener 180 may have four sides 184-1, 184-2, 184-3, 184-4 (e.g., may be rectangular and take the shape of a frame or ring along the perimeter of the planar portion 182 of the stiffener 180). In some embodiments, the stiffener 180 may have more than four sides 184 depending on the shape and number of sides of the die 114.

FIGS. 3C and 3D are magnified views of a portion of the exemplary stiffeners of FIGS. 3A and 3B respectively, in accordance with various embodiments. FIG. 3C shows a bottom portion of the side 184-1 including cutouts 187 having a rectangular shape. FIG. 3D shows a bottom portion of the side 184-1 including cutouts 187 having a semi-circular shape. The cutouts 187 may have any suitable size and shape, and may be configured to allow any excess underfill material 160 to move or seep to an exterior portion of the side 184 of the stiffener 180. By allowing the excess underfill material 160 to squeeze out, the risk of a tilted stiffener is reduced and the increased underfill material 160 along the side 184 enables better adhesion of the stiffener 180 to the package substrate 102.

FIGS. 4A-4C are schematic illustrations of top plane views of exemplary microelectronic assemblies including trenches, in accordance with various embodiments. FIG. 4A shows a die 114 on a package substrate 102 and a material 164, such as a solder resist material, disposed on the package substrate 102 forming two linear trenches 165 for positioning two sides 184 of a stiffener 180 over the die 114 and on the package substrate 102. Although FIG. 4A illustrates two trenches 165, a stiffener 180 may have more than two sides 184. FIG. 4B shows a die 114 on a package substrate 102 and a material 164, such as a solder resist material, disposed on the package substrate 102 forming four linear trenches 165 for positioning four sides 184 of a stiffener 180 over the die 114 and on the package substrate 102. FIG. 4C shows a die 114 on a package substrate 102 and a material 164, such as a solder resist material, disposed on the package substrate 102 forming two L-shaped trenches 165 for positioning two adjacent sides 184 of a four-sided stiffener 180 over the die 114 and on the package substrate 102. Although the trenches 165 shown in FIG. 4 are linear, a trench 165 may have any suitable shape, including a non-linear shape, such as curved. Although the material 164 forming the trenches 165 in FIG. 4 is shown as lines, the material 164 may have any suitable size and shape, and may cover a larger portion of the package substrate 102, as shown in FIG. 2A.

Any suitable techniques may be used to manufacture the microelectronic assemblies 100 disclosed herein. For example, FIGS. 5A-5D are side, cross-sectional views of an exemplary process for manufacturing a microelectronic assembly, in accordance with various embodiments. Although the operations discussed below with reference to FIGS. 5A-5D (and others of the accompanying drawings representing manufacturing processes) are illustrated in a particular order, these operations may be performed in any suitable order. Further, additional operations which are not illustrated may also be performed without departing from the scope of the present disclosure. Also, various ones of the operations discussed herein with respect to FIGS. 5A-5D may be modified in accordance with the present disclosure to fabricate others of microelectronic assembly 100 disclosed herein.

Figure 5A:
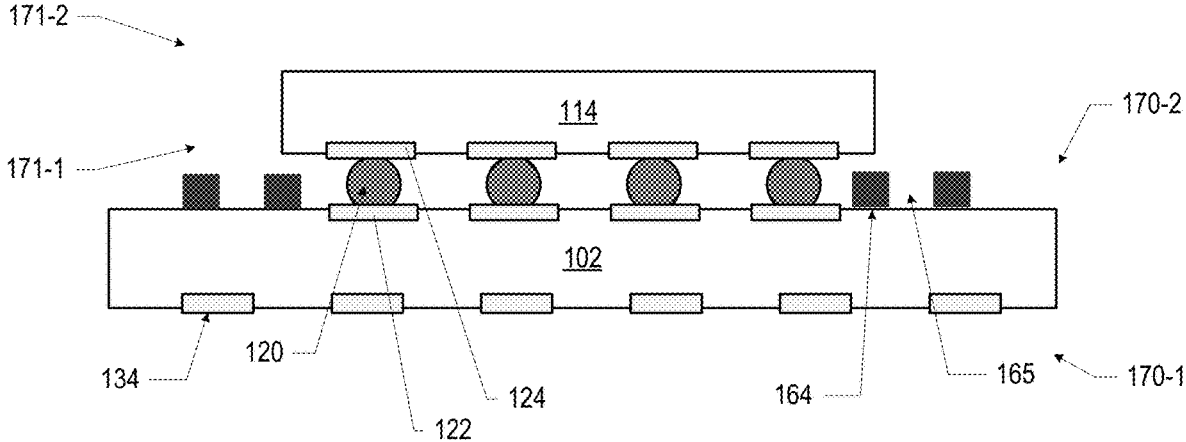
FIGS. 5A-5D are side, cross-sectional views of an exemplary process for manufacturing a microelectronic assembly, in accordance with various embodiments.

FIG. 5A illustrates an assembly subsequent to mounting a die 114 on a second surface 170-2 of a package substrate 102 and forming first level interconnects 120 between respective conductive contacts 124 on a first surface 171-1 of the die 114 and respective conductive contacts 122 on the second surface 170-2 of the package substrate 102. Any suitable method may be used to place the die 114, for example, automated pick-and-place. In some embodiments, the first level interconnects 120 may include solder. In such embodiments, the assembly of FIG. 5A may be subjected to a solder reflow process during which solder components of the first level interconnects 120 melt and bond to mechanically and electrically couple the die 114 to the top surface 170-2 of the package substrate 102.

The second surface 170-2 of the package substrate may further include one or more trenches 165 formed by a material 164, such as a solder resist material. In some embodiments, the material 164 may be deposited on the package substrate 102 prior to manufacturing of the assembly.

Figure 5B:
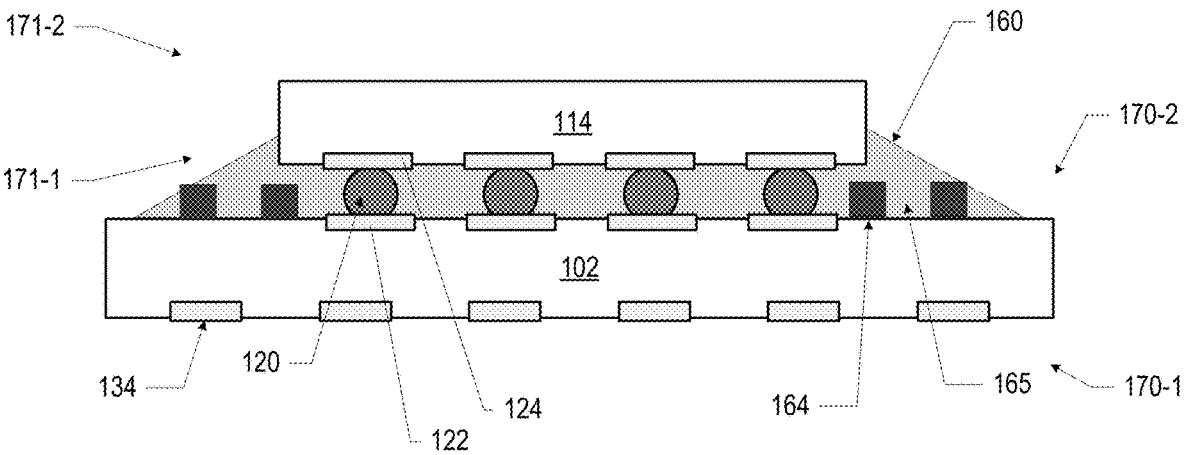

FIG. 5B illustrates an assembly subsequent to dispensing an underfill material 160 around the first level interconnects 120 and in and around the trenches 165. The underfill material 160 may include any suitable material and may be dispensed using any suitable process, including as described above with reference to FIG. 1.

Figure 5C:
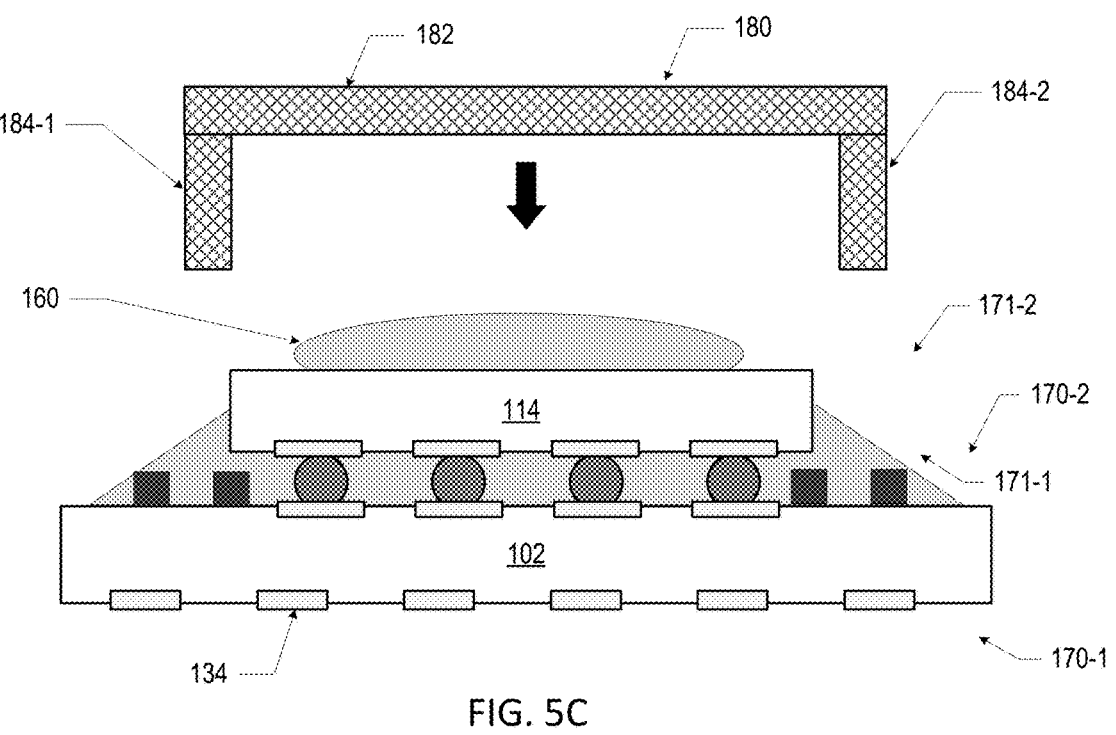

FIG. 5C illustrates an assembly subsequent to depositing the underfill material 160 or an other material (e.g., the second material 162 of FIG. 2A, such as a TIM, an overmold material, or an adhesive material) on a top surface 171-2 of the die 114 and aligning a stiffener 180 over the die 114. The underfill material 160 or other material may include any suitable material and may be dispensed using any suitable process.

Figure 5D:
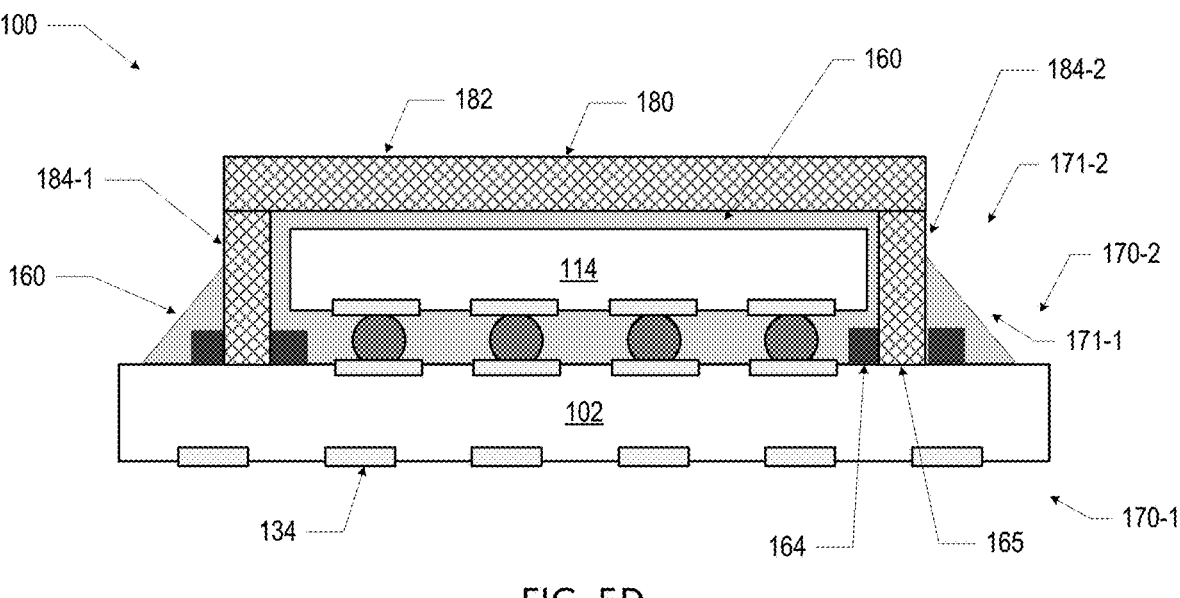

FIG. 5D illustrates an assembly subsequent to placing a stiffener 180 on and over a top surface 171-2 of the die 114, aligning the sides 184-1, 184-2 to be positioned with the trenches 165, and concurrently curing the underfill material 160 on and around the die 114, to secure the stiffener 180 to the second surface 170-2 of the package substrate 102. The assembly of FIG. 5D may itself be a microelectronic assembly 100, as shown. If multiple assemblies are manufactured together, the assemblies may be singulated after curing. Further manufacturing operations may be performed on the microelectronic assembly 100 of FIG. 5D to form other microelectronic assembly 100; for example, the conductive contacts 134 with solder (not shown) on a first surface 170-1 of the package substrate 102 may be used to couple the microelectronic assembly 100 of FIG. 5D to a circuit board 133 via second level interconnects 130, similar to the microelectronic assembly 100 of FIG. 1.

Figure 6:
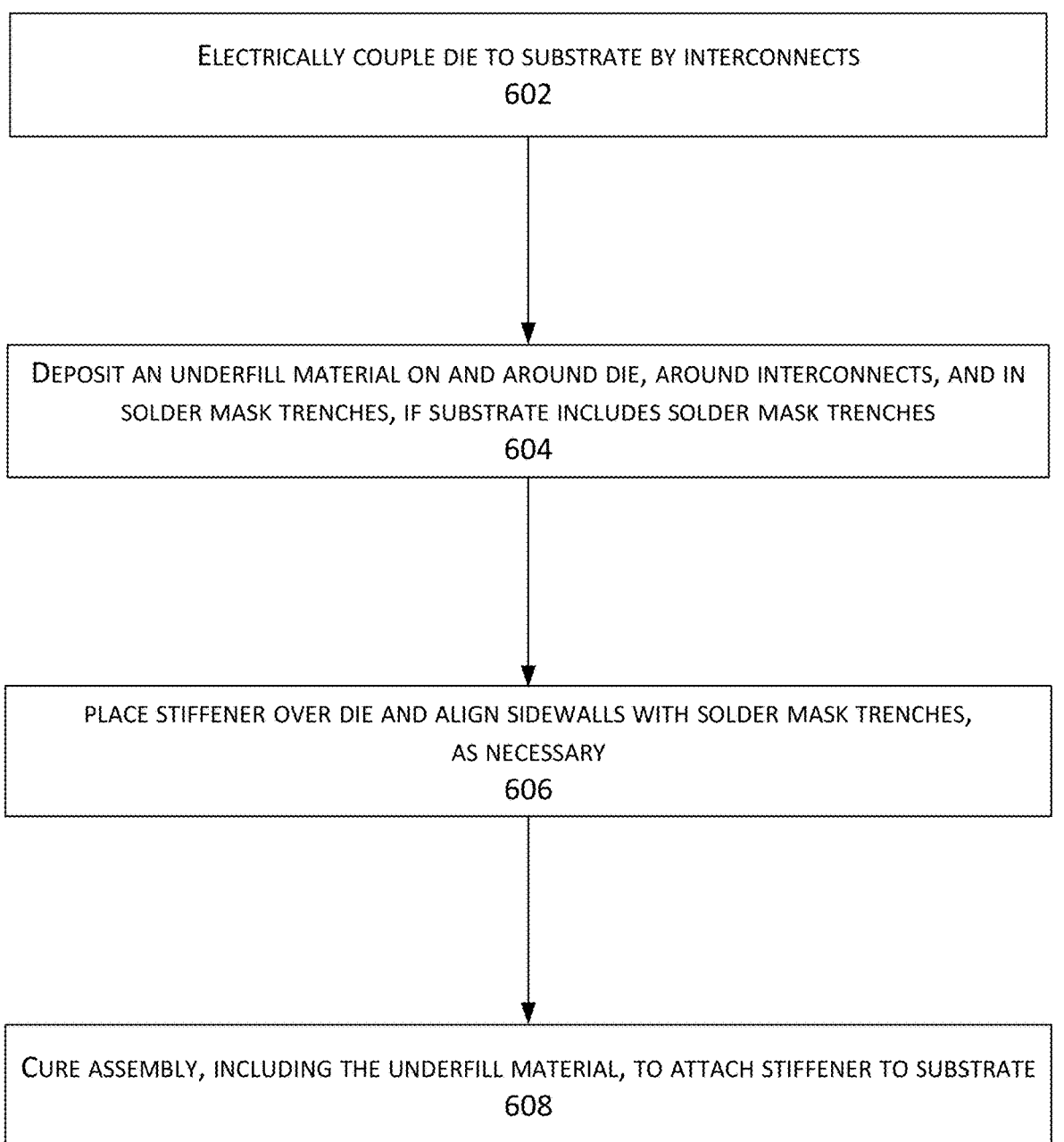
FIG. 6 is a flow diagram of an example method of manufacturing a microelectronic assembly, in accordance with various embodiments.

FIG. 6 is a flow diagram of an example method of manufacturing a microelectronic assembly, in accordance with various embodiments. At 602, a die 114 may be electrically coupled to a substrate 102 by forming first level interconnects 120. At 604, an underfill material 160 may be dispensed around the first level interconnects 120 and, if trenches 165 are formed on the package substrate 102, in and around the trenches 165. In some embodiments, the underfill material 160 may be dispensed on and around the die 114. In some embodiments, an other material may be dispensed on the top surface 171-2 of the die 114. In some embodiments, the trenches 165 may be formed by a solder resist material. At 606, a stiffener 180 having a planar portion 182 and two or more sides 184 may be placed on and over the die 114 where the planar portion 182 of the stiffener 180 is on a top surface 171-2 of the die 114 and the two or more sides 184 extend along two or more respective sides of the die 114. The sides 184 of the stiffener 180 may be positioned to align with the trenches 165 on the surface 170-2 of the package substrate 102. At 608, the assembly, including the underfill material 160 may be cured to secure the stiffener 180 to the package substrate 102 and to the die 114.

Figure 8:
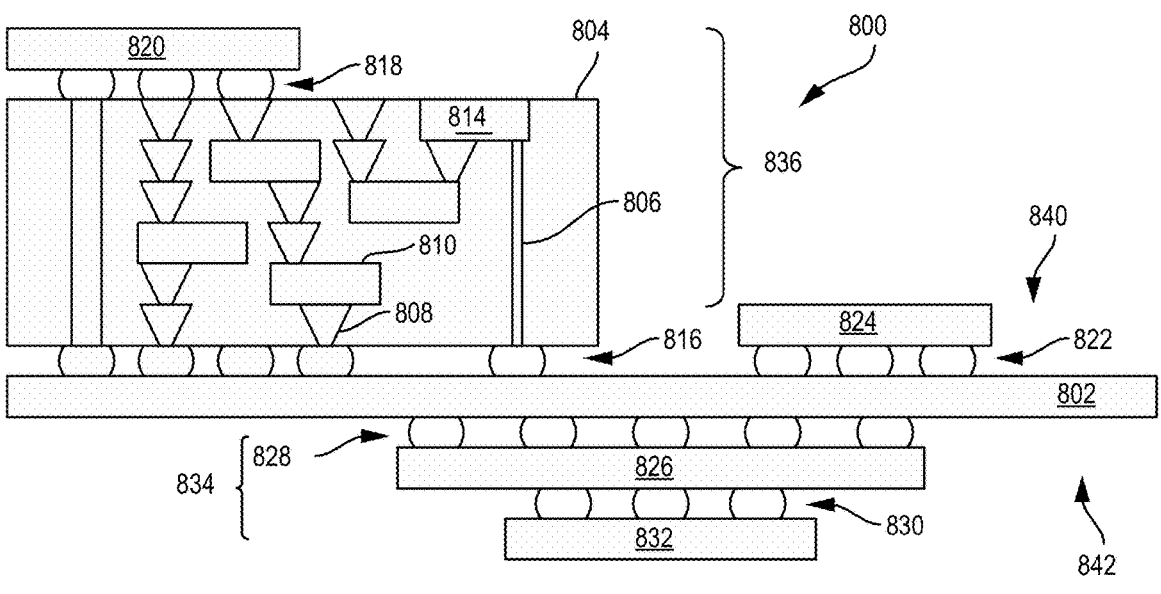
FIG. 8 is a cross-sectional side view of an integrated circuit device assembly that may include any of the embodiments of the microelectronic assemblies disclosed herein.
Figure 9:
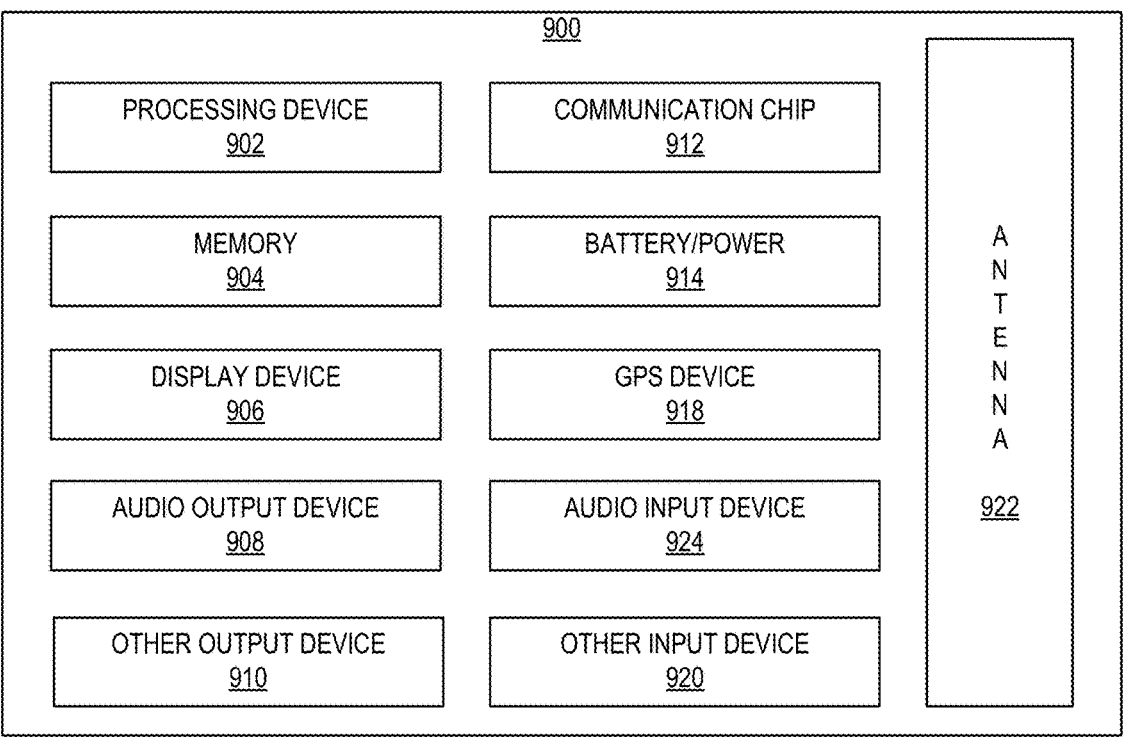
FIG. 9 is a block diagram of an example computing device that may include any of the embodiments of the microelectronic assemblies disclosed herein.

The microelectronic assemblies disclosed herein may be included in any suitable electronic device. FIGS. 7-9 illustrate various examples of apparatuses that may be included in, or that may include, one or more of any of the microelectronic assemblies disclosed herein.

FIGS. 7A and 7B are top views of a wafer 701 and dies 705 that may be included in any of the microelectronic assemblies disclosed herein. The wafer 701 may be composed of semiconductor material and may include one or more dies 705 having IC elements formed on a surface of the wafer 701. Each of the dies 705 may be a repeating unit of a semiconductor product that includes any suitable IC. After the fabrication of the semiconductor product is complete, the wafer 701 may undergo a singulation process in which each of the dies 705 is separated from one another to provide discrete "chips" of the semiconductor product. The die 705 may include one or more transistors (e.g., some of the transistors 740 of FIG. 7C, discussed below) and/or supporting circuitry to route electrical signals to the transistors, as well as any other IC components. In some embodiments, the wafer 701 or the die 705 may include a memory device (e.g., a static random access memory (SRAM) device), a logic device (e.g., AND, OR, NAND, or NOR gate), or any other suitable circuit element. Multiple ones of these devices may be combined on a single die 705. For example, a memory array formed by multiple memory devices may be formed on a same die 705 as a processing device (e.g., the processing device 902 of FIG. 9) or other logic that is configured to store information in the memory devices or execute instructions stored in the memory array. In some embodiments, the die 705 may include circuitry that is to couple to and interact with circuitry provided by integral devices in the package substrate, after the die 705 is coupled to the package substrate, as discussed above.

FIG. 7C is a cross-sectional side view of an IC device 700 that may be included in a die that may be included in any of the microelectronic assemblies disclosed herein. In particular, one or more of the IC devices 700 may be included in one or more dies. The IC device 700 may be formed on a substrate 702 (e.g., the wafer 701 of FIG. 7A) and may be included in a die (e.g., the die 705 of FIG. 7B). The substrate 702 may be a semiconductor substrate composed of semiconductor material systems including, for example, N-type or P-type materials systems. The substrate 702 may include, for example, a crystalline substrate formed using a bulk silicon or a silicon-on-insulator substructure. In some embodiments, the substrate 702 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 702. Although a few examples of materials from which the substrate 702 may be formed are described here, any material that may serve as a foundation for an IC device 700 may be used. The substrate 702 may be part of a singulated die (e.g., the dies 705 of FIG. 7B) or a wafer (e.g., the wafer 701 of FIG. 7A).

The IC device 700 may include one or more device layers 704 disposed on the substrate 702. The device layer 704 may include features of one or more transistors 740 (e.g., metal oxide semiconductor field-effect transistors (MOSFETs)) formed on the substrate 702. The device layer 704 may include, for example, one or more source and/or drain (S/D) regions 720, a gate 722 to control current flow in the transistors 740 between the S/D regions 720, and one or more S/D contacts 724 to route electrical signals to/from the S/D regions 720. The transistors 740 may include additional features not depicted for the sake of clarity, such as device isolation regions, gate contacts, and the like. The transistors 740 are not limited to the type and configuration depicted in FIG. 7C and may include a wide variety of other types and configurations such as, for example, planar transistors, non-planar transistors, or a combination of both. Nonplanar transistors may include FinFET transistors, such as double-gate transistors or tri-gate transistors, and wraparound or all-around gate transistors, such as nanoribbon and nanowire transistors.

Each transistor 740 may include a gate 722 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 740 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 740 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 720 may be formed within the substrate 702 adjacent to the gate 722 of each transistor 740. The S/D regions 720 may be formed using either an implantation/diffusion process or an etching/deposition process, for example. In the former process, dopants such as boron, aluminum, antimony, phosphorous, or arsenic may be ion-implanted into the substrate 702 to form the S/D regions 720. An annealing process that activates the dopants and causes them to diffuse farther into the substrate 702 may follow the ion-implantation process. In the latter process, the substrate 702 may first be etched to form recesses at the locations of the S/D regions 720. An epitaxial deposition process may then be carried out to fill the recesses with material that is used to fabricate the S/D regions 720. In some implementations, the S/D regions 720 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 720 may be formed using one or more alternate semiconductor materials such as germanium or a group III-V material or alloy. In further embodiments, one or more layers of metal and/or metal alloys may be used to form the S/D regions 720.

Electrical signals, such as power and/or input/output (I/O) signals, may be routed to and/or from the transistors 740 of the device layer 704 through one or more interconnect layers disposed on the device layer 704 (illustrated in FIG. 7C as interconnect layers 706-710). For example, electrically conductive features of the device layer 704 (e.g., the gate 722 and the S/D contacts 724) may be electrically coupled with the interconnect structures 728 of the interconnect layers 706-710. The one or more interconnect layers 706-710 may form an interlayer dielectric (ILD) stack 719 of the IC device 700.

The interconnect structures 728 may be arranged within the interconnect layers 706-710 to route electrical signals according to a wide variety of designs (in particular, the arrangement is not limited to the particular configuration of interconnect structures 728 depicted in FIG. 7C). Although a particular number of interconnect layers 706-710 is depicted in FIG. 7C, embodiments of the present disclosure include IC devices having more or fewer interconnect layers than depicted.

In some embodiments, the interconnect structures 728 may include trench structures 728a (sometimes referred to as "lines") and/or via structures 728b (sometimes referred to as "holes") filled with an electrically conductive material such as a metal. The trench structures 728a may be arranged to route electrical signals in a direction of a plane that is substantially parallel with a surface of the substrate 702 upon which the device layer 704 is formed. For example, the trench structures 728a may route electrical signals in a direction in and out of the page from the perspective of FIG. 7C. The via structures 728b may be arranged to route electrical signals in a direction of a plane that is substantially perpendicular to the surface of the substrate 702 upon which the device layer 704 is formed. In some embodiments, the via structures 728b may electrically couple trench structures 728a of different interconnect layers 706-710 together.

The interconnect layers 706-710 may include a dielectric material 726 disposed between the interconnect structures 728, as shown in FIG. 7C. In some embodiments, the dielectric material 726 disposed between the interconnect structures 728 in different ones of the interconnect layers 706-710 may have different compositions; in other embodiments, the composition of the dielectric material 726 between different interconnect layers 706-710 may be the same.

A first interconnect layer 706 (referred to as Metal 1 or "M1") may be formed directly on the device layer 704. In some embodiments, the first interconnect layer 706 may include trench structures 728a and/or via structures 728b, as shown. The trench structures 728a of the first interconnect layer 706 may be coupled with contacts (e.g., the S/D contacts 724) of the device layer 704.

A second interconnect layer 708 (referred to as Metal 2 or "M2") may be formed directly on the first interconnect layer 706. In some embodiments, the second interconnect layer 708 may include via structures 728b to couple the trench structures 728a of the second interconnect layer 708 with the trench structures 728a of the first interconnect layer 706. Although the trench structures 728a and the via structures 728b are structurally delineated with a line within each interconnect layer (e.g., within the second interconnect layer 708) for the sake of clarity, the trench structures 728a and the via structures 728b may be structurally and/or materially contiguous (e.g., simultaneously filled during a dual-damascene process) in some embodiments.

A third interconnect layer 710 (referred to as Metal 3 or "M3") (and additional interconnect layers, as desired) may be formed in succession on the second interconnect layer 708 according to similar techniques and configurations described in connection with the second interconnect layer 708 or the first interconnect layer 706.

The IC device 700 may include a solder resist material 734 (e.g., polyimide or similar material) and one or more bond pads 736 formed on the interconnect layers 706-710. The bond pads 736 may provide the contacts to couple to first level interconnects, for example. The bond pads 736 may be electrically coupled with the interconnect structures 728 and configured to route the electrical signals of the transistor(s) 740 to other external devices. For example, solder bonds may be formed on the one or more bond pads 736 to mechanically and/or electrically couple a chip including the IC device 700 with another component (e.g., a circuit board). The IC device 700 may have other alternative configurations to route the electrical signals from the interconnect layers 706-710 than depicted in other embodiments. For example, the bond pads 736 may be replaced by or may further include other analogous features (e.g., posts) that route the electrical signals to external components.

FIG. 8 is a cross-sectional side view of an IC device assembly 800 that may include any of the embodiments of the microelectronic assemblies disclosed herein. The IC device assembly 800 includes a number of components disposed on a circuit board 802. The IC device assembly 800 may include components disposed on a first face 840 of the circuit board 802 and an opposing second face 842 of the circuit board 802; generally, components may be disposed on one or both faces 840 and 842.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. For example, the coupling components 818 may be second level interconnects. Although a single IC package 820 is shown in FIG. 8, multiple IC packages may be coupled to the interposer 804; indeed, additional interposers may be coupled to the interposer 804. The interposer 804 may provide an intervening substrate used to bridge the circuit board 802 and the IC package 820. The IC package 820 may be or include, for example, a die (the die 705 of FIG. 7B), an IC device (e.g., the IC device 700 of FIG. 7C), or any other suitable component. In particular, the IC package 820 may take any of the embodiments of the IC package substrates disclosed herein, and may include a package substrate with a conductive element having a cavity for a passive component and where the conductive element is electrically connected to the passive component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804; in other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some embodiments, the interposer 804 may be formed of alternate rigid or flexible materials that may include the same materials used in a semiconductor substrate, such as silicon, germanium, and other group Ill-V and group IV materials. The interposer 804 may include metal interconnects 808 and vias 810, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820. In particular, the IC package 824 may take the form of any of the embodiments of the IC package disclosed herein, and may include a package substrate with a conductive element having a cavity for a passive component and where the conductive element is electrically connected to the passive component.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. In particular, the IC packages 826 and 832 may take any of the embodiments of the IC package substrate with a conductive element having a cavity for a passive component and where the conductive element is electrically connected to the passive component disclosed herein.

FIG. 9 is a block diagram of an example computing device 900 that may include one or more of the microelectronic assemblies disclosed herein. A number of components are illustrated in FIG. 9 as included in the computing device 900, but any one or more of these components may be omitted or duplicated, as suitable for the application. In some embodiments, some or all of the components included in the computing device 900 may be attached to one or more motherboards. In some embodiments, some or all of these components are fabricated onto a single system-on-a-chip (SoC) die.

Additionally, in various embodiments, the computing device 900 may include interface circuitry for coupling to the one or more components. For example, the computing device 900 may not include a display device 906, but may include display device interface circuitry (e.g., a connector and driver circuitry) to which a display device 906 may be coupled. In another set of examples, the computing device 900 may not include an audio input device 924 or an audio output device 908, but may include audio input or output device interface circuitry (e.g., connectors and supporting circuitry) to which an audio input device 924 or audio output device 908 may be coupled.

The computing device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 904 may include memory that shares a die with the processing device 902. This memory may be used as cache memory and may include embedded dynamic random access memory (eDRAM) or spin transfer torque magnetic random-access memory (STT-MRAM).

In some embodiments, the computing device 900 may include a communication chip 912 (e.g., one or more communication chips). For example, the communication chip 912 may be configured for managing wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 912 may operate in accordance with other wireless protocols in other embodiments. The computing device 900 may include an antenna 922 to facilitate wireless communications and/or to receive other wireless communications (such as AM or FM radio transmissions).

In some embodiments, the communication chip 912 may manage wired communications, such as electrical, optical, or any other suitable communication protocols (e.g., the Ethernet). As noted above, the communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as GPS, EDGE, GPRS, CDMA, WiMAX, LTE, EV-DO, or others. In some embodiments, a first communication chip 912 may be dedicated to wireless communications, and a second communication chip 912 may be dedicated to wired communications.

The computing device 900 may include battery/power circuitry 914. The battery/power circuitry 914 may include one or more energy storage devices (e.g., batteries or capacitors) and/or circuitry for coupling components of the computing device 900 to an energy source separate from the computing device 900 (e.g., AC line power).

The computing device 900 may include a display device 906 (or corresponding interface circuitry, as discussed above). The display device 906 may include any visual indicators, such as a heads-up display, a computer monitor, a projector, a touchscreen display, a liquid crystal display (LCD), a light-emitting diode display, or a flat panel display, for example.

The computing device 900 may include an audio output device 908 (or corresponding interface circuitry, as discussed above). The audio output device 908 may include any device that generates an audible indicator, such as speakers, headsets, or earbuds, for example.

The computing device 900 may include an audio input device 924 (or corresponding interface circuitry, as discussed above). The audio input device 924 may include any device that generates a signal representative of a sound, such as microphones, microphone arrays, or digital instruments (e.g., instruments having a musical instrument digital interface (MIDI) output).

The computing device 900 may include a global positioning system (GPS) device 918 (or corresponding interface circuitry, as discussed above). The GPS device 918 may be in communication with a satellite-based system and may receive a location of the computing device 900, as known in the art.

The computing device 900 may include an other output device 910 (or corresponding interface circuitry, as discussed above). Examples of the other output device 910 may include an audio codec, a video codec, a printer, a wired or wireless transmitter for providing information to other devices, or an additional storage device.

The computing device 900 may include an other input device 920 (or corresponding interface circuitry, as discussed above). Examples of the other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 900 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 900 may be any other electronic device that processes data.

The following examples pertain to further embodiments. The various features of the different embodiments may be variously combined with some features included and others excluded to suit a variety of different applications.

Example 1 is a microelectronic assembly, including a substrate; a lid surrounding an individual die, wherein the lid includes a planar portion and two or more sides extending from the planar portion, and wherein the individual die is electrically coupled to the substrate by interconnects; and a material surrounding the interconnects and coupling the two or more sides of the lid to the substrate.

Example 2 may include the subject matter of Example 1, and may further specify that the lid includes at least three sides.

Example 3 may include the subject matter of Example 1, and may further specify that the lid includes at least four sides.

Example 4 may include the subject matter of any of Examples 1-3, and may further specify that a material of the lid includes a metal, a metal alloy, a plastic, or a ceramic.

Example 5 may include the subject matter of any of Examples 1-4, and may further specify that the material includes an underfill material.

Example 6 may include the subject matter of any of Examples 1-5, and may further specify that the material is between the substrate and the lid.

Example 7 may include the subject matter of any of Examples 1-6, and may further specify that the material is between the planar portion of the lid and the die.

Example 8 may include the subject matter of any of Examples 1-7, and may further specify that the material is a first material, and the microelectronic assembly may further include a second material between the planar portion of the lid and the individual die.

Example 9 may include the subject matter of Example 8, and may further specify that the second material includes a thermal interface material (TIM).

Example 10 may include the subject matter of any of Examples 1-9, and may further specify that the interconnects include solder.

Example 11 may include the subject matter of any of Examples 1-10, and may further specify that the two or more sides include cutouts.

Example 12 may include the subject matter of any of Examples 1-11, and may further specify that a bottom edge of the two or more sides includes a rail.

Example 13 may include the subject matter of any of Examples 1-12, and may further specify that the substrate further includes a trench for positioning the two or more sides of the lid on the substrate.

Example 14 may include the subject matter of Example 13, and may further specify that a material of the trench includes a solder mask.

Example 15 may include the subject matter of any of Examples 1-14, and may further specify that a thickness of the planar portion of the lid is between 200 microns and 400 microns.

Example 16 may include the subject matter of any of Examples 1-15, and may further specify that a width of each of the two or more sides is between 200 microns and 400 microns.

Example 17 may include the subject matter of Example 7, and may further specify that a thickness of the material between the planar portion of the lid and the die is between 25 microns and 50 microns.

Example 18 may include the subject matter of any of Examples 1-17, and may further specify that the material extends at least partially along a thickness of the two or more sides towards the planar portion of the lid.

Example 19 may include the subject matter of any of Examples 1-18, and may further specify that the lid is a first lid, the individual die is a first individual die, and the interconnects are first interconnects, and the microelectronic assembly further includes a second lid surrounding a second individual die, wherein the lid includes a planar portion and two or more sides extending from the planar portion, wherein the second individual die is electrically coupled to the substrate by second interconnects, and wherein the material surrounds the second interconnects and couples the two or more sides of the second lid to the substrate.

Example 20 may include the subject matter of any of Examples 1-19, and may further include a second die electrically coupled to the substrate by second interconnects.

Example 21 is a microelectronic assembly, including a package substrate; a die having a first surface, an opposing second surface, a first side surface, and a second side surface, wherein the first and second side surfaces extend between the first surface and the second surface, and wherein the first surface of the die is electrically coupled to the package substrate by interconnects; a material surrounding the interconnects; and a component having a surface, a first sidewall, and a second sidewall, wherein the first and second sidewalls extend from the surface of the component, wherein the surface of the component is coupled to the second surface of the die, wherein the first and second sidewalls of the component extend along the respective first and second side surfaces of the die towards the package substrate, and wherein the first and second sidewalls of the component are coupled to the package substrate by the material surrounding the interconnects.

Example 22 may include the subject matter of Example 21, and may further specify that the die further includes a third side surface extending between the first and second surfaces of the die, wherein the component further includes a third sidewall extending from the surface of the component, and wherein the third sidewall of the component extends along the third side surface of the die towards the package substrate and is coupled to the package substrate by the material surrounding the interconnects.

Example 23 may include the subject matter of Example 22, and may further specify that the die further includes a fourth side surface extending between the first and second surfaces of the die, wherein the component further includes a fourth sidewall extending from the surface of the component, and wherein the fourth sidewall of the component extends along the fourth side surface of the die towards the package substrate and is coupled to the package substrate by the material surrounding the interconnects.

Example 24 may include the subject matter of any of Examples 21-23, and may further specify that a material of the component includes a metal, a metal alloy, a plastic, or a ceramic.

Example 25 may include the subject matter of any of Examples 21-24, and may further specify that the material includes an underfill material.

Example 26 may include the subject matter of any of Examples 21-25, and may further specify that the material is between the package substrate and the component.

Example 27 may include the subject matter of any of Examples 21-26, and may further specify that the material is between the surface of the component and the die.

Example 28 may include the subject matter of any of Examples 21-27, and may further specify that the material is a first material, and the microelectronic assembly further comprises a second material between the surface of the component and the die.

Example 29 may include the subject matter of Example 28, and may further specify that the second material includes a thermal interface material (TIM).

Example 30 may include the subject matter of any of Examples 21-29, and may further specify that the interconnects include solder.

Example 31 may include the subject matter of any of Examples 21-30, and may further specify that the first or second sidewall includes a cutout.

Example 32 may include the subject matter of any of Examples 21-31, and may further specify that the first or second sidewall includes a rail on a bottom edge.

Example 33 may include the subject matter of any of Examples 21-32, and may further specify that the package substrate further includes a trench for positioning the first and second sidewalls of the component on the package substrate.

Example 34 may include the subject matter of Example 33, and may further specify that a material of the trench includes a solder mask.

Example 35 may include the subject matter of any of Examples 21-34, and may further specify that a thickness of the surface of the component is between 200 microns and 400 microns.

Example 36 may include the subject matter of any of Examples 21-35, and may further specify that a width of the first sidewall is between 200 microns and 400 microns.

Example 37 may include the subject matter of Example 27, and may further specify that a thickness of the material between the surface of the component and the die is between 25 microns and 50 microns.

Example 38 may include the subject matter of any of Examples 21-37, and may further specify that the material extends at least partially along a thickness of the first or second sidewalls towards the surface of the component.

Example 39 may include the subject matter of any of Examples 21-38, and may further specify that the component is a first component, the die is a first die, and the interconnects are first interconnects, and the microelectronic assembly further includes a second die having a first surface, an opposing second surface, a first side surface, and a second side surface, wherein the first and second side surfaces extend between the first and second surfaces of the second die, and wherein the first surface of the second die is electrically coupled to the package substrate by second interconnects, wherein the material surrounds the second interconnects; and a second component having a surface, a first sidewall, and a second sidewall, wherein the first and second sidewalls extend from the surface of the second component, wherein the surface of the second component is coupled to a second surface of the second die, wherein the first and second sidewalls of the second component extend along the respective first and second side surfaces of the second die towards the package substrate, and wherein the first and second sidewalls of the second component are coupled to the package substrate by the material surrounding the second interconnects.

Example 40 may include the subject matter of any of Examples 21-39, and may further specify that the component is configured to mitigate warpage of the die.

Example 41 may include the subject matter of any of Examples 21-40, and may further specify that the die is selected from the group consisting of a central processing unit, a platform controller hub, a memory die, a field programmable gate array silicon die, and graphic processing unit.

Example 42 may include the subject matter of any of Examples 21-41, and may further specify that the microelectronic assembly is included in a server device.

Example 43 may include the subject matter of any of Examples 21-41, and may further specify that the microelectronic assembly is included in a portable computing device.

Example 44 may include the subject matter of any of Examples 21-41, and may further specify that the microelectronic assembly is included in a wearable computing device.

Example 45 may include the subject matter of any of Examples 21-44, and may further include a second die coupled to the surface of the package substrate.

Example 46 is a computing device, including a circuit board; and an integrated circuit (IC) package electrically coupled to the circuit board, wherein the IC package includes a package substrate; a stiffener surrounding a single die, wherein the stiffener includes a planar portion and two or more sides extending from the planar portion, and wherein the die is electrically coupled to the package substrate by interconnects; and an underfill material surrounding the interconnects and coupling the two or more sides of the stiffener to the package substrate.

Example 47 may include the subject matter of Example 46, and may further specify that the stiffener is configured to mitigate warpage of the die.

Example 48 may include the subject matter of Examples 46 or 47, and may further specify that a thickness of the planar portion of the stiffener is between 200 microns and 400 microns.

Example 49 may include the subject matter of any of Examples 46-48, and may further specify that a width of each of the two or more sides is between 200 microns and 400 microns.

Example 50 may include the subject matter of any of Examples 46-49, and may further specify that a thickness of the material between the planar portion of the stiffener and the die is between 25 microns and 50 microns.

Example 51 may include the subject matter of any of Examples 46-50, and may further specify that the material extends at least partially along a thickness of the two or more sides towards the planar portion of the stiffener.

Example 52 may include the subject matter of any of Examples 46-51, and may further specify that the die is one of a central processing unit, a platform controller hub, a field programmable gate array silicon die, and graphic processing unit.

Example 53 may include the subject matter of any of Examples 46-51, and may further specify that the die is a memory die.

Example 54 may include the subject matter of any of Examples 46-53, and may further specify that the computing device is included in a server device.

Example 55 may include the subject matter of any of Examples 46-53, and may further specify that the computing device is included in a portable computing device.

Example 56 may include the subject matter of any of Examples 46-53, and may further specify that the computing device is included in a wearable computing device.

Example 57 is a method for fabricating a microelectronic assembly, the method including placing a die on a surface of a substrate, the die having a first surface and an opposing second surface; electrically coupling the first surface of the die to the substrate by forming interconnects between the die and the substrate; depositing a material around the interconnects; placing a lid over the second surface of the die, wherein the lid includes a planar portion and at least two sides extending from the planar portion towards the surface of the substrate, and wherein the material around the interconnects extends along, at least a portion of, the at least two sides of the lid; and curing the material to couple the lid to the surface of the substrate.

Example 58 may include the subject matter of Example 57, and may further specify that a material of the lid includes a metal, a metal alloy, a plastic, or a ceramic.

Example 59 may include the subject matter of Examples 57 or 58, and may further specify that the material includes an underfill material.

Example 60 may include the subject matter of any of Examples 57-59, and may further specify that the material is between the substrate and the lid.

Example 61 may include the subject matter of any of Examples 57-60, and may further specify that the material is between the planar portion of the lid and the die.

Example 62 may include the subject matter of any of Examples 57-60, and may further include a thermal interface material (TIM) between the planar portion of the lid and the die.

Example 63 may include the subject matter of any of Examples 57-62, and may further specify that the interconnects include solder.

Example 64 may include the subject matter of any of Examples 57-63, and may further specify that the substrate further includes a trench for positioning the at least two sides of the lid on the substrate.

Example 65 is a microelectronic assembly, including a package substrate; a die having a first surface, an opposing second surface, a first side surface, and a second side surface, wherein the first and second side surfaces extend between the first surface and the second surface, and wherein the first surface of the die is electrically coupled to the package substrate by interconnects; and a stiffener having a surface, a first sidewall, and a second sidewall, wherein the surface of the stiffener is coupled to the second surface of the die, wherein the first and second sidewalls of the stiffener extend along the respective first and second side surfaces of the die towards the package substrate, and wherein the first and second sidewalls of the stiffener are coupled to the package substrate by an underfill material that surrounds the interconnects.

Example 66 is a microelectronic assembly, including a package substrate; a die having a first surface, an opposing second surface, and a side surface extending between the first surface and the second surface, wherein the first surface of the die is electrically coupled to the package substrate by interconnects; and a stiffener having a surface and a sidewall, wherein the surface of the stiffener is coupled to the second surface of the die and the sidewall of the stiffener extends along the side surface of the die towards the package substrate, and wherein the sidewall of the stiffener is coupled to the package substrate by an underfill material.

The invention claimed is:

1. A microelectronic assembly, comprising:
a substrate;
a lid surrounding an individual die, wherein the lid includes a planar portion and two or more sides extending from the planar portion, and wherein the individual die is electrically coupled to the substrate by interconnects; and
a material surrounding the interconnects and coupling the two or more sides of the lid to the substrate; wherein:
the substrate further includes a trench and the two or more sides of the lid are partially disposed in the trench, wherein a material of the trench includes a solder mask.

2. The microelectronic assembly of claim 1, wherein the lid includes at least three sides.

3. The microelectronic assembly of claim 1, wherein the lid includes at least four sides.

4. The microelectronic assembly of claim 1, wherein a material of the lid includes a metal, a metal alloy, a plastic, or a ceramic.

5. The microelectronic assembly of claim 1, wherein the material includes an underfill material.

6. The microelectronic assembly of claim 1, wherein the material is between the substrate and the lid.

7. The microelectronic assembly of claim 1, wherein the material is between the planar portion of the lid and the individual die.

8. The microelectronic assembly of claim 1, wherein the two or more sides include cutouts.

9. The microelectronic assembly of claim 1, wherein a bottom edge of the two or more sides includes a rail.

10. A microelectronic assembly, comprising:
a package substrate;
a die having a first surface, an opposing second surface, a first side surface, and an opposing second side surface, wherein the first and second side surfaces extend between the first surface and the second surface, and wherein the first surface of the die is electrically coupled to the package substrate by interconnects;
a material surrounding the interconnects; and
a component having a surface, a first sidewall, and a second sidewall, wherein the first and second sidewalls extend from the surface of the component, wherein the surface of the component is coupled to the second surface of the die, wherein the first and second sidewalls of the component extend along the respective first and second side surfaces of the die towards the package substrate, and wherein:
the first and second sidewalls of the component are coupled to the package substrate by the material surrounding the interconnects; and
the substrate further includes a trench and the first and second sidewalls of the component are partially disposed in the trench, wherein a material of the trench includes a solder mask.

11. The microelectronic assembly of claim 10, wherein the die further includes a third side surface extending between the first and second surfaces of the die, wherein the component further includes a third sidewall extending from the surface of the component, and wherein the third sidewall of the component extends along the third side surface of the die towards the package substrate and is coupled to the package substrate by the material surrounding the interconnects.

12. The microelectronic assembly of claim 10, wherein the material includes an underfill material.

13. The microelectronic assembly of claim 10, wherein the material is a first material, and the microelectronic assembly further comprises:
a second material between the surface of the component and the die.

14. The microelectronic assembly of claim 13, wherein the second material includes a thermal interface material (TIM).

15. A computing device, comprising:
a circuit board; and
an integrated circuit (IC) package electrically coupled to the circuit board, wherein the IC package comprises:
a package substrate comprising a trench, wherein a material of the trench includes a solder mask;
a stiffener surrounding a single die, wherein the stiffener includes a planar portion and two or more sides extending from the planar portion and partially disposed in the trench, and wherein the single die is electrically coupled to the package substrate by interconnects; and
an underfill material surrounding the interconnects and coupling the two or more sides of the stiffener to the package substrate.

16. The computing device of claim 15, wherein a thickness of the planar portion of the stiffener is between 200 microns and 400 microns.

17. The computing device of claim 15, wherein a width of each of the two or more sides is between 200 microns and 400 microns.

18. The computing device of claim 15, wherein a thickness of the material between the planar portion of the stiffener and the single die is between 25 microns and 50 microns.

* * * * *